(12) United States Patent
Bower et al.

(10) Patent No.: US 9,991,413 B2
(45) Date of Patent: *Jun. 5, 2018

(54) SYSTEMS AND METHODS FOR PREPARING GAN AND RELATED MATERIALS FOR MICRO ASSEMBLY

(71) Applicant: X-Celeprint Limited, Cork (IE)

(72) Inventors: Christopher Bower, Raleigh, NC (US); Matthew Meitl, Durham, NC (US)

(73) Assignee: X-Celeprint Limited, Cork (IE)

( * ) Notice: Subject to any disclaimer, the term of this patent is extended or adjusted under 35 U.S.C. 154(b) by 0 days. days.

This patent is subject to a terminal disclaimer.

(21) Appl. No.: 15/668,466

(22) Filed: Aug. 3, 2017

(65) Prior Publication Data

US 2017/0358703 A1    Dec. 14, 2017

Related U.S. Application Data

(63) Continuation of application No. 14/743,984, filed on Jun. 18, 2015, now Pat. No. 9,761,754.
(Continued)

(51) Int. Cl.
*H01L 21/00* (2006.01)
*H01L 23/24* (2006.01)
(Continued)

(52) U.S. Cl.
CPC ..........  *H01L 33/007* (2013.01); *H01L 21/187* (2013.01); *H01L 21/2007* (2013.01);
(Continued)

(58) Field of Classification Search
CPC .  H01L 33/007; H01L 21/187; H01L 21/2007; H01L 21/7806; H01L 24/81; H01L 25/50; H01L 33/0079; H01L 33/32
See application file for complete search history.

(56) References Cited

U.S. PATENT DOCUMENTS 5,621,555 A    4/1997    Park
5,815,303 A    9/1998    Berlin
(Continued)

FOREIGN PATENT DOCUMENTS

JP    2011066130 A    3/2011
WO    WO-2008/103931 A2    8/2008
(Continued)

OTHER PUBLICATIONS

International Search Report, PCT/EP2015/063711, Sep. 29, 2015.
(Continued)

*Primary Examiner* — Alonzo Chambliss
(74) *Attorney, Agent, or Firm* — William R. Haulbrook; Alexander D. Augst; Choate, Hall & Stewart LLP

(57) ABSTRACT

The disclosed technology relates generally to a method and system for micro assembling GaN materials and devices to form displays and lighting components that use arrays of small LEDs and high-power, high-voltage, and or high frequency transistors and diodes. GaN materials and devices can be formed from epitaxy on sapphire, silicon carbide, gallium nitride, aluminum nitride, or silicon substrates. The disclosed technology provides systems and methods for preparing GaN materials and devices at least partially formed on several of those native substrates for micro assembly.

19 Claims, 16 Drawing Sheets

Related U.S. Application Data

(60) Provisional application No. 62/014,070, filed on Jun. 18, 2014.

(51) Int. Cl.
*H01L 33/00* (2010.01)
*H01L 23/00* (2006.01)
*H01L 21/78* (2006.01)
*H01L 21/20* (2006.01)
*H01L 21/18* (2006.01)
*H01L 25/00* (2006.01)
*H01L 33/22* (2010.01)
*H01L 33/44* (2010.01)

(52) U.S. Cl.
CPC .......... *H01L 21/7806* (2013.01); *H01L 24/81* (2013.01); *H01L 25/50* (2013.01); *H01L 33/0079* (2013.01); *H01L 33/22* (2013.01); *H01L 33/44* (2013.01); *H01L 2924/00011* (2013.01); *H01L 2924/13055* (2013.01); *H01L 2933/0025* (2013.01)

(56) References Cited

U.S. PATENT DOCUMENTS

| | | | |
|---|---|---|---|
| 6,142,358 A | 11/2000 | Cohn et al. | |
| 6,278,242 B1 | 8/2001 | Cok et al. | |
| 6,287,940 B1 | 9/2001 | Cole et al. | |
| 6,577,367 B2 | 6/2003 | Kim | |
| 6,717,560 B2 | 4/2004 | Cok et al. | |
| 6,756,576 B1 | 6/2004 | McElroy et al. | |
| 6,933,532 B2 | 8/2005 | Arnold et al. | |
| 6,953,977 B2 | 10/2005 | Mlcak et al. | |
| 7,129,457 B2 | 10/2006 | McElroy et al. | |
| 7,195,733 B2 | 3/2007 | Rogers et al. | |
| 7,288,753 B2 | 10/2007 | Cok | |
| 7,354,801 B2 | 4/2008 | Sugiyama et al. | |
| 7,521,292 B2 | 4/2009 | Rogers et al. | |
| 7,557,367 B2 | 7/2009 | Rogers et al. | |
| 7,586,497 B2 | 9/2009 | Boroson et al. | |
| 7,622,367 B1 | 11/2009 | Nuzzo et al. | |
| 7,662,545 B2 | 2/2010 | Nuzzo et al. | |
| 7,704,684 B2 | 4/2010 | Rogers et al. | |
| 7,799,699 B2 | 9/2010 | Nuzzo et al. | |
| 7,816,856 B2 | 10/2010 | Cok et al. | |
| 7,893,612 B2 | 2/2011 | Cok | |
| 7,927,976 B2 | 4/2011 | Menard | |
| 7,932,123 B2 | 4/2011 | Rogers et al. | |
| 7,943,491 B2 | 5/2011 | Nuzzo et al. | |
| 7,972,875 B2 | 7/2011 | Rogers et al. | |
| 7,982,296 B2 | 7/2011 | Nuzzo et al. | |
| 7,999,454 B2 | 8/2011 | Winters et al. | |
| 8,029,139 B2 | 10/2011 | Ellinger et al. | |
| 8,039,847 B2 | 10/2011 | Nuzzo et al. | |
| 8,198,621 B2 | 6/2012 | Rogers et al. | |
| 8,207,547 B2 | 6/2012 | Lin | |
| 8,261,660 B2 | 9/2012 | Menard | |
| 8,334,545 B2 | 12/2012 | Levermore et al. | |
| 8,394,706 B2 | 3/2013 | Nuzzo et al. | |
| 8,440,546 B2 | 5/2013 | Nuzzo et al. | |
| 8,470,701 B2 | 6/2013 | Rogers et al. | |
| 8,502,192 B2 | 8/2013 | Kwak et al. | |
| 8,506,867 B2 | 8/2013 | Menard | |
| 8,664,699 B2 | 3/2014 | Nuzzo et al. | |
| 8,686,447 B2 | 4/2014 | Tomoda et al. | |
| 8,722,458 B2 | 5/2014 | Rogers et al. | |
| 8,754,396 B2 | 6/2014 | Rogers et al. | |
| 8,766,970 B2 | 7/2014 | Chien et al. | |
| 8,791,474 B1 | 7/2014 | Bibl et al. | |
| 8,794,501 B2 | 8/2014 | Bibl et al. | |
| 8,803,857 B2 | 8/2014 | Cok | |
| 8,817,369 B2 | 8/2014 | Daiku | |
| 8,854,294 B2 | 10/2014 | Sakariya | |
| 8,877,648 B2 | 11/2014 | Bower et al. | |
| 8,889,485 B2 | 11/2014 | Bower | |
| 8,895,406 B2 | 11/2014 | Rogers et al. | |
| 8,987,765 B2 | 3/2015 | Bibl et al. | |
| 9,209,348 B2 | 12/2015 | Hu et al. | |
| 9,368,683 B1 | 6/2016 | Meitl et al. | |
| 9,370,864 B2 | 6/2016 | Bibl et al. | |
| 9,520,537 B2 | 12/2016 | Bower et al. | |
| 9,620,695 B2 | 4/2017 | Hu et al. | |
| 9,640,715 B2 | 5/2017 | Bower et al. | |
| 9,761,754 B2 * | 9/2017 | Bower | H01L 33/007 |
| 9,799,794 B2 | 10/2017 | Bower et al. | |
| 2010/0078656 A1 | 4/2010 | Seo et al. | |
| 2010/0248484 A1 | 9/2010 | Bower et al. | |
| 2010/0317132 A1 | 12/2010 | Rogers et al. | |
| 2012/0228669 A1 | 9/2012 | Bower et al. | |
| 2012/0314388 A1 | 12/2012 | Bower et al. | |
| 2013/0069275 A1 | 3/2013 | Menard et al. | |
| 2013/0088416 A1 | 4/2013 | Smith et al. | |
| 2013/0196474 A1 | 8/2013 | Meitl et al. | |
| 2013/0207964 A1 | 8/2013 | Fleck et al. | |
| 2013/0221355 A1 | 8/2013 | Bower et al. | |
| 2013/0273695 A1 | 10/2013 | Menard et al. | |
| 2014/0084240 A1 | 3/2014 | Hu et al. | |
| 2014/0084482 A1 | 3/2014 | Hu et al. | |
| 2014/0104243 A1 | 4/2014 | Sakariya et al. | |
| 2014/0113404 A1 | 4/2014 | Rossini | |
| 2014/0159065 A1 | 6/2014 | Hu et al. | |
| 2014/0159066 A1 | 6/2014 | Hu et al. | |
| 2014/0264763 A1 | 9/2014 | Meitl et al. | |
| 2014/0267683 A1 | 9/2014 | Bibl et al. | |
| 2014/0340900 A1 * | 11/2014 | Bathurst | F21K 9/00 362/249.02 |
| 2014/0363928 A1 | 12/2014 | Hu et al. | |
| 2014/0367633 A1 | 12/2014 | Bibl et al. | |
| 2015/0135525 A1 | 5/2015 | Bower | |
| 2015/0137153 A1 | 5/2015 | Bibl et al. | |
| 2015/0169011 A1 | 6/2015 | Bibl et al. | |
| 2015/0263066 A1 | 9/2015 | Hu et al. | |
| 2017/0025563 A1 | 1/2017 | Meitl et al. | |
| 2017/0206845 A1 | 7/2017 | Sakariya et al. | |
| 2018/0006186 A1 | 1/2018 | Bower et al. | |

FOREIGN PATENT DOCUMENTS

| | | |
|---|---|---|
| WO | WO-2010/111601 A2 | 9/2010 |
| WO | WO-2015/193436 A1 | 12/2015 |
| WO | WO-2016/184769 A1 | 11/2016 |

OTHER PUBLICATIONS

Lee, S. H. et al, Laser Lift-Offof GaN Thin Film and its Application to the Flexible Light Emitting Diodes, Proc. of SPIE 8460:846011-1-846011-6 (2012).

Roscher, H., VCSEL Arrays with Redundant Pixel Designs for 10Gbits/s 2-D Space-Parallel MMF Transmission, Annual Report, optoelectronics Department, (2005).

Written Opinion, PCT/EP2015/063711, dated Sep. 29, 2015.

Yaniv et al., A 640 x 480 Pixel Computer Display Using Pin Diodes with Device Redundancy, 1988 International Display Research Conference, IEEE, CH-2678-1/88:152-154 (1988).

* cited by examiner

| Native substrate | Materials for micro assembly | Absorbing layer | Devices |
|---|---|---|---|
| Sapphire | GaN, AlGaN, InGaN, AlInGaN, SiN, also non epitaxial, e.g. CVD or PVD materials. | GaN | LEDs, HEMTs, Diodes, lasers, color converters |
| Gallium Arsenide | GaAs, InGaAlP, InGaP, InAlP, AlGaAs, (In)GaNAs(Sb), InGaAsP, (Si)Ge, SiGeSn, also non epitaxial, e.g. CVD or PVD materials. | (In)GaNAs(Sb), (Si)Ge, SiGeSn | LEDs, HEMTs, HBTs, lasers, VCSELs, diodes, photodiodes, solar cells, zener diodes, schottky diodes, color converters |
| Indium Phosphide | InGaAs, InAlGaAs, InAlAs, InGaAsP, InP, InGaAlAsP, GeSn, SiGeSn, also non epitaxial, e.g. CVD or PVD materials. | InGaAs, InGaAsP, InGaAlAs, GeSn, SiGeSn | LEDs, HEMTs, HBTs, lasers, VCSELs, diodes, photodiodes, solar cells, zener diodes, schottky diodes, color converters |
| Silicon on insulator | Si, SiGe, InGaAs nanostructures | Si, SiGe, SiN, metals | Integrated circuits, diodes, schottky diodes, IGBTs, passives (conductors), capacitors |

FIG. 4

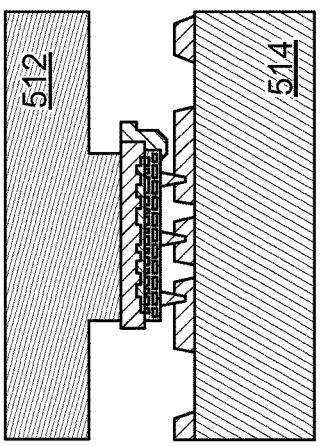
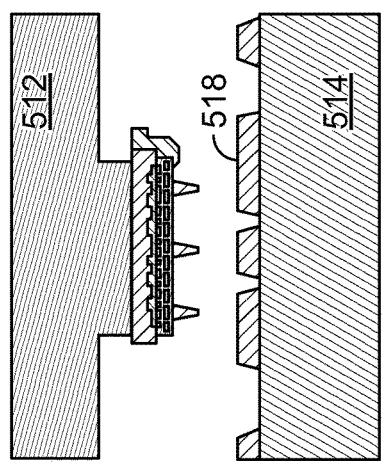
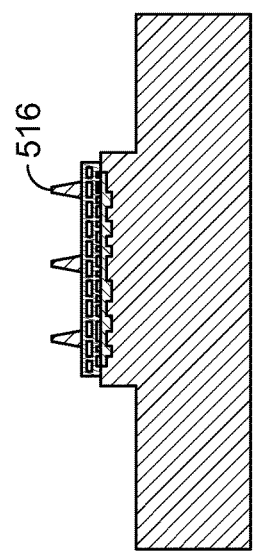
FIG. 5K

SYSTEMS AND METHODS FOR PREPARING GAN AND RELATED MATERIALS FOR MICRO ASSEMBLY

RELATED APPLICATION

This application is a continuation of U.S. patent application Ser. No. 14/743,984, filed Jun. 18, 2015, titled "Systems and Methods for Preparing GaN and Related Materials for Micro Assembly," which claims priority to and the benefit of U.S. Provisional Patent Application No. 62/014,070, filed Jun. 18, 2014, titled "Systems and Methods for Preparing GaN and Related Materials for Micro Assembly," the contents of which are incorporated by reference herein in its entirety.

FIELD OF THE INVENTION

The present invention relates to structures and methods for providing micro-scale devices that can be printed using massively parallel micro-transfer printing methods.

BACKGROUND

The disclosed technology relates generally to the formation of transferable micro devices. Semiconductor chip or die-automated assembly equipment typically use vacuum-operated placement heads, such as vacuum grippers or pick-and-place tools, to pick up and apply devices to a substrate. It is often difficult to pick up and place ultra-thin and/or small devices using this technology. Micro transfer printing permits the selection and application of these ultra-thin, fragile, and/or small devices without cause damage to the devices themselves.

Micro-structured stamps can be used to pick up micro devices, transport the micro devices to the destination, and print the micro devices onto a destination substrate. Surface adhesion forces are used to control the selection and printing of these devices onto the destination substrate. This process can be performed massively in parallel. The stamps can be designed to transfer hundreds to thousands of discrete structures in a single pick-up and print operation.

Micro transfer printing also enables parallel assembly of high-performance semiconductor devices onto virtually any substrate material, including glass, plastics, metals or other semiconductors. The substrates can be flexible, thereby permitting the production of flexible electronic devices. Flexible substrates can be integrated in a large number of configurations, including configurations not possible with brittle silicon-based electronic devices. Additionally, plastic substrates, for example, are mechanically rugged and can be used to provide electronic devices that are less susceptible to damage and/or electronic performance degradation caused by mechanical stress. Thus, these materials can be used to fabricate electronic devices by continuous, high-speed printing techniques capable of generating electronic devices over large substrate areas at low cost (e.g., roll to roll manufacturing).

Moreover, these micro transfer printing techniques can be used to print semiconductor devices at temperatures compatible with assembly on plastic polymer substrates. In addition, semiconductor materials can be printed onto large areas of substrates thereby enabling continuous, high-speed printing of complex integrated electrical circuits over large substrate areas. Moreover, fully flexible electronic devices with good electronic performance in flexed or deformed device orientations can be provided to enable a wide range of flexible electronic devices.

Electronically active components can be printed over the non-native substrates. For example, these printing techniques can be used to form imaging devices such as flat-panel liquid crystal, LED, or OLED display devices and/or in digital radiographic plates. In each instance, the electronically active components must be transferred from a native substrate to a destination substrate (e.g., a non-native substrate on which an array of the active components is distributed). The active components are picked up from the native substrate and transferred to the destination substrate using an elastomer stamp. The release of the active components must be controlled and predictable.

In micro-transfer printing, the chiplets are typically formed on a silicon substrate and a sacrificial layer undercut by etching to form tethers using photolithographic processes. The silicon substrate facilitates the formation of tethers between the wafer and the chiplet that are broken to release the chiplet during the micro-transfer printing process. However, conventional methods of forming GaN devices do not result in formation of micro-scale devices that can be assembled using micro-transfer printing techniques. Additionally, conventional methods of forming GaN devices do not enable printable GaN devices on sapphire. Although relatively inexpensive when compared to sapphire, silicon has an even larger lattice mismatch with the GaN crystal structures making up the LEDs than sapphire, further reducing the performance of the resulting LEDs. Thus, in some embodiments, it is desirable to form printable structures, such as LEDs, using a sapphire substrate. However, there is no available method for undercutting a chiplet formed on a sapphire substrate to enable chiplet release for micro-transfer printing.

There is a need, therefore, for structures and methods that enable the construction of micro-LED chiplets formed on a substrate (e.g., silicon or sapphire) that can be micro-transfer printed. There is also a need for simple and inexpensive methods and structures enabling electrical interconnections for chiplets printed on destination substrates. Furthermore, there is a need for methods and structures that allow electrically connecting the electrical contacts of printed structures, such as printed LEDs, using fewer processing steps than conventional methods.

Thus, there is a need for predictable and controllable systems and methods for preparing high-performance, small, and dense arrays of structures in GaN and related materials that are suitable for micro-transfer printing.

SUMMARY

In one aspect, the invention is directed to a method of preparing released or releasable structures from a silicon native substrate, the method comprising: depositing one or more members selected from the group consisting of GaN, AlGaN, InGaN, InGaAlN, and SiN on a substrate comprising Si (1 1 1), thereby forming an epitaxial material; forming devices using the epitaxial material on the substrate; delineating releasable structures comprising the devices in the epitaxial material, thereby partially exposing the substrate; forming anchoring structures and tethering structures such that the releasable structures connect the devices to the substrate by the anchoring structures and tethering structures following contact of the substrate with the etchant; removing silicon material underneath the releasable structures with an etchant, thereby forming printable structures comprising the devices, wherein a spatial orientation of the printable structures is maintained by the tether structures and anchor structures; and exposing the substrate and the printable structures connected to the substrate by anchoring structures and/or tethering structures to one or more chemical agents for conditioning the newly exposed surface of the released structures.

In certain embodiments, exposing the substrate and the printable structures to one or more chemical agents comprises exposure to heated phosphoric acid. In certain embodiments, exposing the substrate and the printable structures to one or more chemical agents imparts surface roughness to the newly exposed surface.

In certain embodiments, the etchant is heated tetramethyl ammonium hydroxide, potassium hydroxide, sodium hydroxide or a basic solution for performing anisotropic silicon etch.

In certain embodiments, forming devices comprises depositing and/or patterning a dielectric and/or conductive thin film.

In certain embodiments, the anchoring structures and tethering structures are formed in the epitaxial material.

In certain embodiments, the anchoring and tethering structures are formed from non-epitaxial material.

In certain embodiments, the non-epitaxial material comprises one or more epitaxial materials selected from the group consisting of silicon nitride, silicon oxide.

In certain embodiments, the method further comprises forming one or more encapsulating structures to encapsulate at least a portion of the printable structure.

In certain embodiments, the method further comprises: prior to removing silicon material underneath the structures, forming recesses in the exposed silicon.

In certain embodiments, forming recesses in the exposed silicon comprises etching the exposed silicon.

In certain embodiments, the method further comprises: micro transfer printing one or more printable substructures of the printable structures.

In certain embodiments, said micro transfer printing comprises: contacting one or more printable structures of the printable structures with a conformable transfer device having a contact surface, wherein contact between the contact surface and the one or more printable structures adheres the one or more printable structures to the contact surface; contacting the one or more printable structures disposed on the contact surface with the receiving surface of a destination substrate; and separating the contact surface of the conformable transfer device and the one or more printable structures, wherein the one or more printable structures are transferred onto the receiving surface, thereby assembling the one or more printable structures on the receiving surface of the destination substrate.

In certain embodiments, the conformable transfer device is an elastomer stamp.

In another aspect, the invention is directed to a method of preparing printable materials for micro assembly from a native device substrate using an intermediate substrate having a controlled tackiness, the method comprising: depositing one or more materials on the native device substrate, thereby forming an epitaxial material; forming devices with the epitaxial material on the substrate; delineating releasable structures comprising the devices in the epitaxial material, thereby partially exposing the device substrate; forming anchoring structures and tethering structures such that the releasable structures are connected to the substrate by the anchoring structures and tethering structures following contact of the substrate with the etchant; temporarily bonding the epitaxial material to the intermediate substrate and performing a laser-lift off process, thereby separating the epitaxial material from the device substrate and thereby inverting the epitaxial material for micro assembly, wherein: the controlled tackiness of the intermediate substrate is configured so that a transfer element can remove the materials from the intermediate substrate for micro assembly, and the native substrate is transparent to laser illumination that is absorbed strongly by an absorbing layer on the native substrate so that upon exposure to the laser illumination the absorbing layer at least partially decomposes or otherwise forms an interface that can initiate separation between the native substrate and the devices for micro assembly; at least partially completing the formation or delineation of devices on the intermediate substrate; forming anchoring, tethering, or encapsulation structures insoluble to an etchant for releasing the epitaxial material from the intermediate substrate; releasing the devices from the intermediate substrate by removal of at least a portion of the selectively removable layer positioned between at least a portion of the intermediate substrate and at least a portion of the devices, thereby forming printable micro assemble-able devices from the native substrate via the intermediate substrate; and transferring the released materials for micro assembly on the intermediate substrate to a second intermediate stamp, thereby presenting the epitaxial material for micro assembly in a different un-inverted configuration, the second intermediate stamp also having controlled tackiness such that the second intermediate stamp can remove the materials for micro assembly from the intermediate stamp and a transfer element can remove the epitaxial material for micro assembly from the second intermediate stamp.

In certain embodiments, the device substrate comprises a member selected from the group consisting of sapphire, gallium arsenide, indium phosphide, and silicon on insulator.

In certain embodiments, the one or more materials deposited on the device substrate comprise at least one member selected from the group consisting of GaN, AlGaN, and SiN.

In certain embodiments, the intermediate substrate comprises a stamp. In certain embodiments, the intermediate substrate comprises a conformable elastomer having controlled tackiness.

In certain embodiments, the anchoring structures and tethering structures are formed in the epitaxial material. In certain embodiments, the anchoring and tethering structures are formed from non-epitaxial material.

In certain embodiments, the non-epitaxial material comprises one or more epitaxial materials selected from the group consisting of silicon nitride, silicon oxide.

In certain embodiments, the transfer element comprises an elastomer stamp.

In certain embodiments, the method further comprises performing thermal treatment to temporarily bond the epitaxial material (and/or devices thereon/therein) to the intermediate substrate to form the bonded pair of substrates.

In certain embodiments, the tackiness of the intermediate substrate is controlled by crosslink density, surface chemistry, surface texture, surface composition, elastomer layer thickness, and/or surface topography. In certain embodiments, the tackiness of the intermediate substrate is controlled by pressure or temperature. In certain embodiments, the tackiness of the intermediate substrate is formed by temporary collapse of topographical features or viscoelastic rate-dependent adhesion effects, thereby forming a transient tackiness.

In certain embodiments, the epitaxial material for micro assembly comprises one or more members selected from the group consisting of GaN, AlGaN, InGaN, InGaAlN, and SiN.

In certain embodiments, the native substrate comprises sapphire and the epitaxial material for micro assembly comprises at least one of GaN, AlGaN, InGaN, AlInGaN, SiN, and non-epitaxial material. In certain embodiments, the native substrate comprises gallium arsenide and the epitaxial material for micro assembly comprises at least one of GaAs, InGaAlP, InGaP, InAlP, AlGaAs, (In)GaNAs(Sb), InGaAsP, (Si)Ge, SiGeSn, and non-epitaxial material. In certain embodiments, the native substrate comprises indium phosphide and the epitaxial material for micro assembly comprises at least one of InGaAs, InAlGaAs, InAlAs, InGaAsP, InP, InGaAlAsP, GeSn, SiGeSn, and non-epitaxial material. In certain embodiments, the native substrate comprises silicon on an insulator and the epitaxial material for micro assembly comprises at least one of InGaAs, InAlGaAs, InAlAs, InGaAsP, InP, InGaAlAsP, GeSn, SiGeSn, and non-epitaxial materials.

In certain embodiments, the devices made with the epitaxial material on the substrate comprise one or more members selected from the group consisting of integrated circuits, LEDs, HEMTs, HBTs, lasers, VCSELs, diodes, photodiodes, solar cells, diodes, zener diodes, IGBTs, schottky diodes, capacitors, and color converters.

In another aspect, the invention is directed to a method of preparing released materials for micro assembly from a native sapphire substrate via an intermediate substrate, the method comprising: preparing materials for micro assembly by epitaxial growth on the native sapphire substrate to form an epitaxial material; adhering the materials for micro assembly to an intermediate substrate to form a bonded pair of substrates; performing a laser-lift off process, thereby separating the materials for micro assembly from the native sapphire substrate and separating the bonded pair of substrates, wherein: the materials for micro assembly are thereby inverted, and the sapphire substrate is transparent to laser illumination that is absorbed strongly by an absorbing layer on the sapphire substrate such that upon exposure to the laser illumination the absorbing layer at least partially decomposes or otherwise forms an interface that can initiate separation between the sapphire substrate and the materials for micro assembly; forming anchoring, tethering, and/or encapsulation structures insoluble to an etchant for releasing the materials for micro assembly from the intermediate substrate; and releasing the materials for micro assembly from the intermediate substrate by the removal of at least a portion of a selectively removable layer positioned between at least a portion of the intermediate substrate and at least a portion of the materials for micro assembly, thereby removing the silicon underneath the releasable structures and forming released, micro assemble-able GaN materials or devices from sapphire native substrates via the intermediate substrate.

In certain embodiments, the method further comprises: transferring the released materials for micro assembly on the intermediate substrate to an intermediate stamp, thereby presenting the materials for micro assembly in a different, un-inverted configuration for micro assembly.

In certain embodiments, the method further comprises: prior to forming anchoring, tethering, and/or encapsulation structures, at least partially completing the formation and/or delineation of devices on the intermediate substrate.

In certain embodiments, the method further comprises: after preparing materials for micro assembly by epitaxial growth, at least partially forming a device in materials for micro assembly. In certain embodiments, the method further comprises: after preparing materials for micro assembly by epitaxial growth, delineating releasable structures in epitaxial materials, partially exposing the sapphire substrate. In certain embodiments, the method further comprises: after preparing materials for micro assembly by epitaxial growth, forming anchoring structures and/or tethering structures in the epitaxial materials.

In certain embodiments, the method further comprises: after preparing materials for micro assembly by epitaxial growth, forming anchoring and/or tethering structures from non-epitaxial materials (e.g., silicon nitride or silicon oxide) designed to survive the release process.

In certain embodiments, the method further comprises: after adhering the materials for micro assembly to the intermediate substrate, performing thermal treatment to temporarily bond the materials for micro assembly to the intermediate substrate, thereby forming a bonded pair of substrates.

In certain embodiments, the intermediate substrate is glass, ceramic, silicon, germanium, sapphire, or silicon carbide. In certain embodiments, the intermediate substrate is at least one of photoactive, etchable, and dissolvable.

In certain embodiments, the materials for micro assembly comprise GaN and the native substrate is a sapphire substrate.

In certain embodiments, the materials for micro assembly comprises one or more members selected from the group consisting of GaN, AlGaN, InGaN, InGaAlN, AlInGaN, SiN, and non-epitaxial materials.

BRIEF DESCRIPTION OF THE FIGURES

The foregoing and other objects, aspects, features, and advantages of the present disclosure will become more apparent and better understood by referring to the following description taken in conjunction with the accompanying drawings, in which:

FIG. 4 is a table listing examples of materials and devices for micro assembly, their native substrates, and absorbing layers that can be used in various embodiments of the present invention;

FIGS. 5A-5K illustrate a sequence of steps for forming printable objects from bulk wafers.

Figure 1:
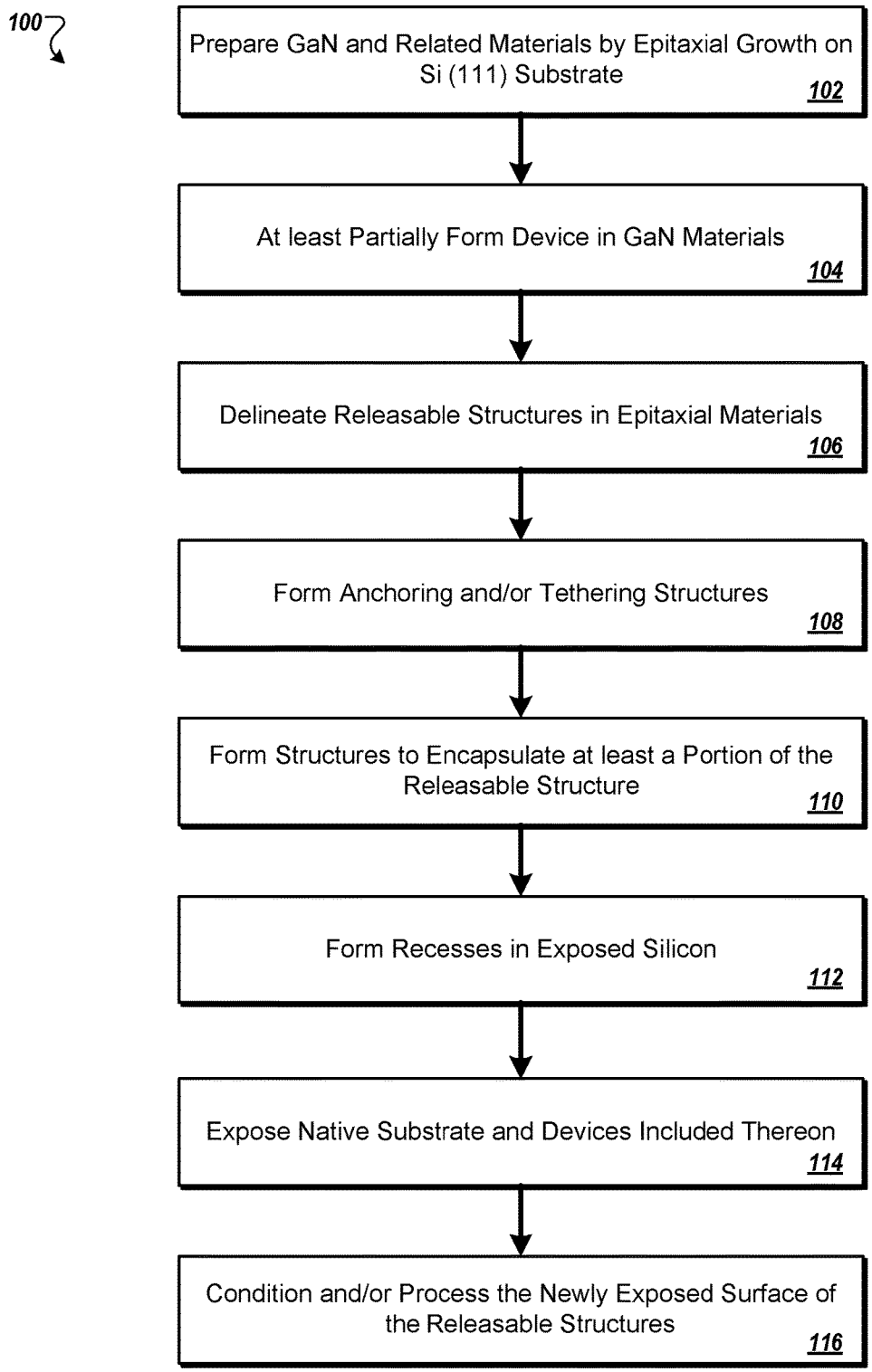
FIG. 1 is a flowchart of an example method for preparing released GaN from silicon substrates.

The features and advantages of the present disclosure will become more apparent from the detailed description set forth below when taken in conjunction with the drawings, in which like reference characters identify corresponding elements throughout. In the drawings, like reference numbers generally indicate identical, functionally similar, and/or structurally similar elements.

DETAILED DESCRIPTION

FIG. 1 is a flowchart of an example method 100 for preparing releasable GaN devices from a silicon substrate. In some embodiments, the GaN and related (e.g. AlGaN, InGaN, InGaAIN, SiN) materials are prepared by epitaxial growth on Si (1 1 1) substrate (102). The device can be at least partially formed in GaN materials (104), for example, by additional patterning of dielectric or conductive thin film materials (104). The releasable structures are delineated in the epitaxial materials, partially exposing the Si (1 1 1) substrate (106). Releasable structures are formed in a source or native wafer substrate and can be released or removed from the wafer by physically contacting the structures with a patterned stamp, for example an elastomer stamp, adhering the structures to the stamp, and removing the stamp and the structures from the wafer. This process is facilitated by partially separating the releasable structures from the wafer by etching away a sacrificial layer from beneath the structures. In some embodiments, the releasable structures are releasable devices themselves. In other embodiments, the releasable structures include the devices as well as other materials, for example, portions of the tether that remain attached to the device after fracturing during a print operation.

In some embodiments, anchoring structures or tethering structures can be formed in the epitaxial materials (108). Such anchoring or tethering structures can have dimensions in the microns and are typically smaller than the releasable devices. Additionally, if desired, anchoring and/or tethering structures can be formed from non-epitaxial materials, such as silicon nitride or silicon oxide, and designed to survive the release etch process. These structures can maintain the spatial configuration of the object through the release process. Structures that maintain the spatial configuration, often referred to as anchors, tethers, or other stabilization structures, can include photoresist materials, epoxies, polyimides, dielectrics, metals, and/or semiconductors. Such structures maintain contact to the native substrate or other fixed body throughout the release process. In certain embodiments, photodefinable materials are advantageous for this kind of anchoring/tethering structure, offering ease of formation and, in many cases, ease of removal by dissolution in wet chemicals, organic solvents or aqueous mixtures, or by ashing in oxygen or fluorine compounds.

In some embodiments, structures are formed to encapsulate at least a portion of the releasable structure (110) which includes the devices at least partially formed in step 104. In some embodiments, the encapsulation is formed to cover the releasable structure. The encapsulation material encapsulates the active components of the releasable device from the chemistries used in the release process.

Figure 6:
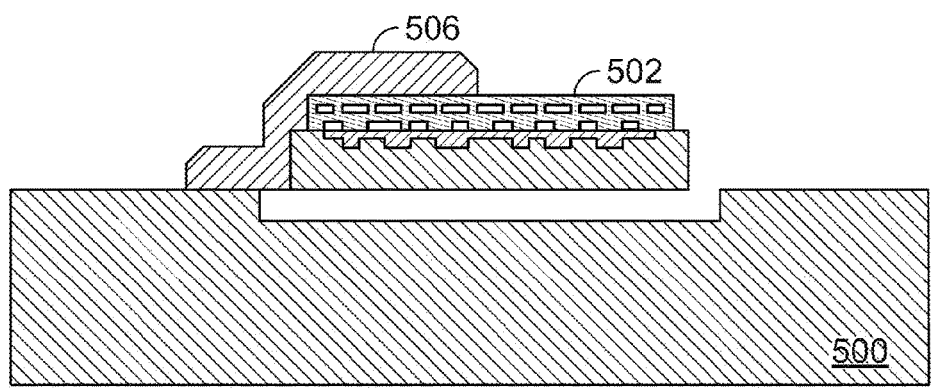
FIG. 6 illustrates a step for forming printable objects from bulk wafers.

In some embodiments, recesses (e.g., trenches) can be formed in exposed silicon, for example, by etching or ablation (112) to enable releasable structures, anchors, and/or tethers to be formed. The native substrate and releasable devices included thereon are exposed to an anisotropic silicon etch, for example, heated tetramethyl ammonium hydroxide or potassium hydroxide, or sodium hydroxide or other basic solutions, thereby performing a release etch and removing the silicon underneath the releasable structures (114) (see e.g., FIG. 6). In some embodiments, the substrate and the released structures connected thereto are exposed to chemical agents for conditioning or processing the newly exposed surface of the releasable structures (116). This can be done to impart surface roughness by, for example, exposure to heated phosphoric acid. This can also improve print yield when the releasable devices are released and transferred to the destination substrate. Thus, the method 100 can be used to form released, micro assemble-able GaN materials or devices from silicon native substrates.

Figure 2:
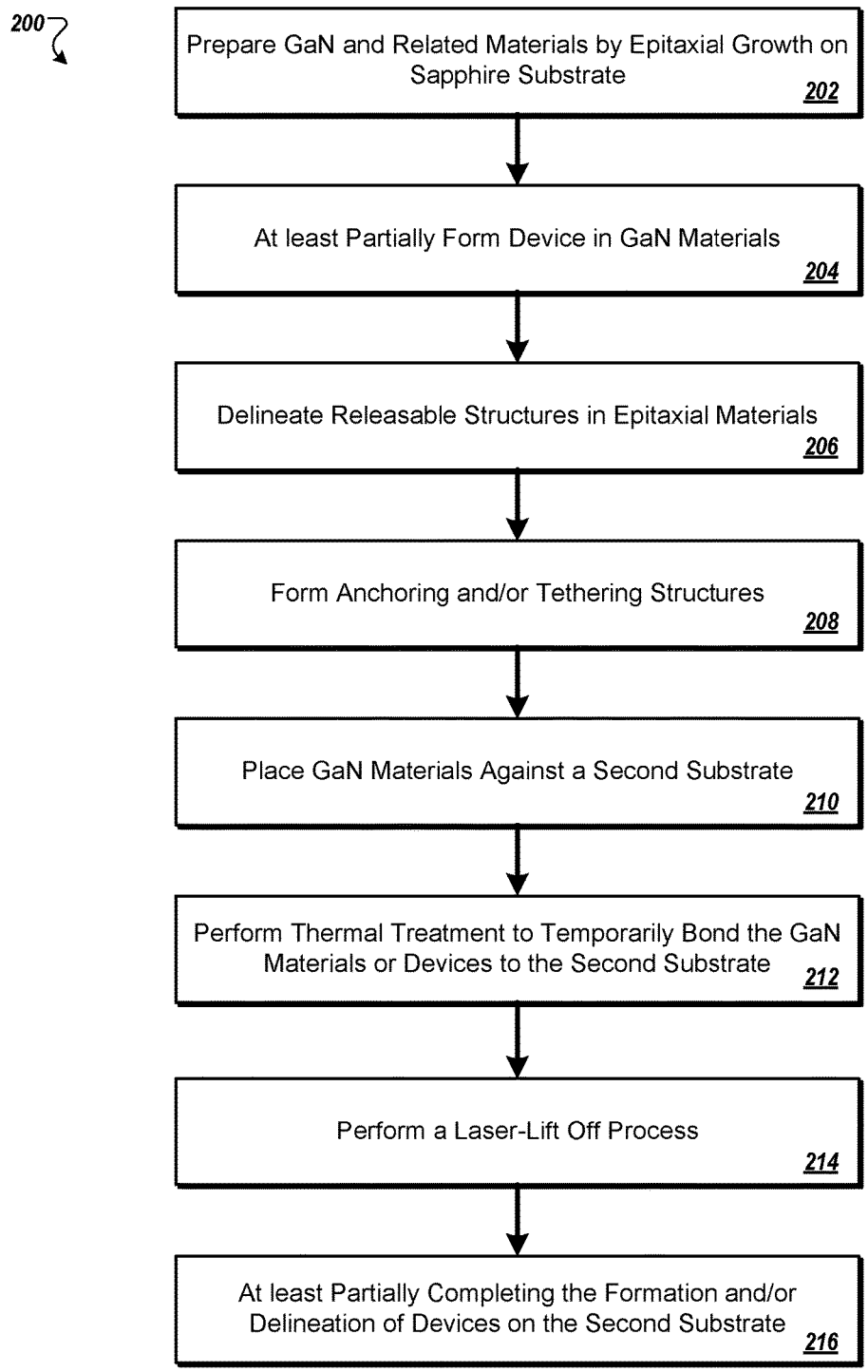
FIG. 2 is a flowchart of an example method for preparing released GaN from sapphire substrates via an intermediate stamp.

FIG. 2 is a flowchart of an example method 200 for preparing printable GaN from a sapphire substrate via an intermediate stamp. In some embodiments, GaN and related (e.g., AlGaN, InGaN, InGaAIN, SiN) materials are prepared by epitaxial growth on a sapphire substrate (202).

In some embodiments, a device can be at least partially formed in GaN materials, for example, by the addition and patterning of dielectric or conductive thin-film materials (204). Dielectric materials can include oxides or nitrides, such as silicon oxide or silicon nitride. Conductive thin-film materials can include patterned metal, for example deposited by evaporation or sputtering, or doped semiconductor material such as doped silicon. The printable structures can be delineated in epitaxial materials (206). This can be accomplished by partially exposing the sapphire substrate. Additionally, anchoring structures or tethering structures can be formed (208). The anchoring or tethering structures can be formed in the epitaxial materials or using non-epitaxial materials, such as silicon nitride or silicon oxide. The materials that form the tethers or anchors are chosen to survive the release etch process such that the anchors/tethers remain attached to the substrate, thereby preserving the spatial orientation of the structures The GaN materials are placed against a second substrate (210). The second substrate can be elastomer, polydimethylsiloxane, glass, metal, polymer, or plastic. An adhesive layer can be used to adhere the second substrate to the devices.

In some embodiments, a thermal treatment to temporarily bond the GaN materials or devices to the second substrate can be performed (212). This forms a bonded pair of substrates, having one substrate as the native sapphire substrate and the second acting as a handover substrate that includes a conformable elastomer and having controlled tackiness. The tackiness can be controlled by crosslink density, surface chemistry, surface texture, surface composition, elastomer layer thickness, and/or surface topography. The tackiness can also be controlled by pressure or temperature. Furthermore, the tackiness can be transient by temporary collapse of topographical features or viscoelastic rate-dependent adhesion effects.

In some embodiments, a laser-lift off process is performed (214), thereby separating the GaN materials or devices from their native sapphire substrate and separating the bonded pair of substrates. After the laser-lift off process, the GaN devices can be inverted and adhered to the second substrate that has a controlled tackiness. The controlled tackiness is selected such that a transfer element (e.g., one that includes an elastomer, e.g., PDMS) can remove the GaN from the second substrate for micro assembly. Moreover, the released GaN on the intermediate stamp can be transferred to a second intermediate stamp, thereby presenting the GaN in a different, un-inverted, configuration. The second intermediate stamp can also have a controlled tackiness, optionally temperature, pressure and/or rate-controlled tackiness, such that the second intermediate stamp can remove the GaN from the intermediate stamp and a transfer element can remove the GaN from the second intermediate stamp.

In some embodiments, the method 200 can include at least partially completing the formation or delineation of device on the second substrate (216). This can be accomplished, for example, by addition of metal(s) (e.g., Au, Cu, Ag, Al, Pd, Pt, Ni, Co, Pb, Ti, Fe, Cr, V, W, etc.) or dielectric film(s) (e.g., $SiO_2$, $Si3N5$, $Al_2O_3$, $ZrO2$, $TiO2$, $Ta2O5$, Barium-strontium-titanate (BST/BSTO), Strontium-titanate-oxide (STO), Lead-zirconium-titanate (PZT), etc.), and/or etching a portion of the GaN materials. Thus, the method 200 can be used to form released, micro assemble-able inverted GaN materials or devices from sapphire native substrates via an intermediate stamp.

Figure 3:
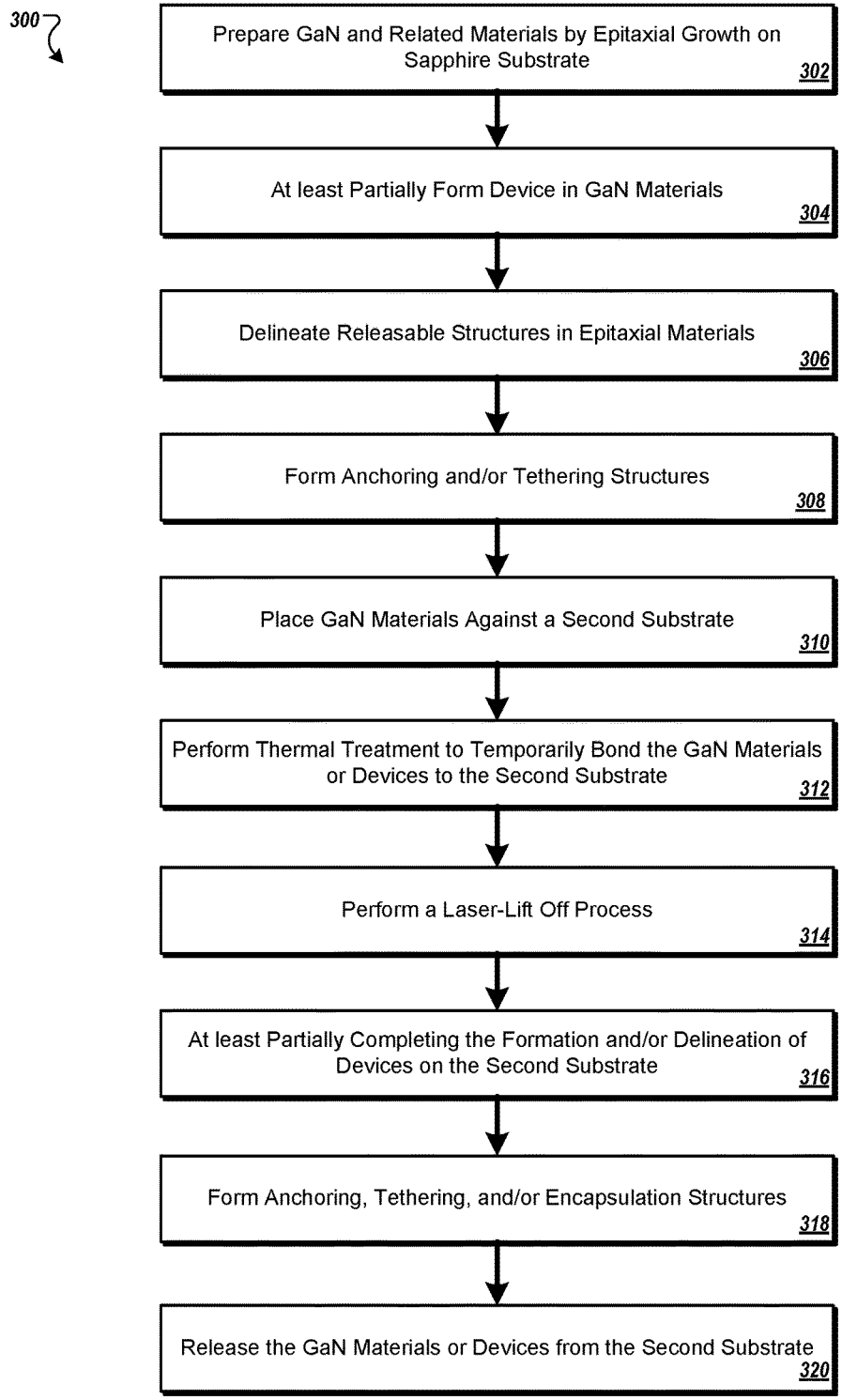
FIG. 3 is a flowchart of a method for preparing released GaN from sapphire substrates via an intermediate substrate.

FIG. 3 is a flowchart of a method 300 for preparing released GaN from sapphire native substrates via an intermediate substrate. In some embodiments, the method 300 includes preparing GaN and related (e.g., AlGaN, InGaN, InGaAlN, SiN) materials by epitaxial growth on sapphire substrate (302). In some embodiments, the device can be at least partially formed in GaN materials (304), for example, by the addition and patterning of dielectric (e.g., $SiO_2$, Si3N5, $Al_2O_3$, ZrO2, TiO2, Ta2O5, Barium-strontium-titanate (BST/BSTO), Strontium-titanate-oxide (STO), Lead-zirconium-titanate (PZT), etc.) or conductive (e.g., including Au, Cu, Ag, Al, Pd, Pt, Ni, Co, Pb, Ti, Fe, Cr, V, W, etc.) thin-film materials. Additionally, releasable structures can be delineated in epitaxial materials (306). This can be accomplished by partially exposing the sapphire substrate. In some embodiments, anchoring structures and/or tethering structures can be formed (308). The anchoring structures and/or tethering structures can be formed in the epitaxial materials or from non-epitaxial materials, such as silicon nitride or silicon oxide, designed to survive the release etch process.

The GaN materials are placed against a second substrate (310) thereby forming a bonded pair of substrates having one substrate as the native sapphire substrate and the second as a substrate comprising a conformable elastomer and having controlled tackiness. In some embodiments, thermal treatment to temporarily bond the GaN materials or devices to the second substrate can be performed (312), thereby forming a bonded pair of substrates, having one substrate as the native sapphire substrate. The second substrate can be (i) a glass, ceramic, silicon, germanium, sapphire, silicon carbide, or other compound semiconductor substrate that includes a polymer that can flow or conform under heat and/or pressure and is optionally photoactive, etchable or dissolvable, (ii) a glass, ceramic, silicon, germanium, sapphire, silicon carbide, or other compound semiconductor substrate that includes a metal that can flow or conform under heat and/or pressure and is optionally etchable or dissolvable, or (iii) a glass, ceramic, silicon, germanium, sapphire, silicon carbide, or other compound semiconductor substrate that includes a material that can flow or conform under heat and/or pressure and another underlying layer of material that is removable, etchable, or dissolvable, such as Si (1 1 1), photoresist, lift-off resist, or metal.

A laser-lift off process is performed (314) to separate the GaN materials or devices from their native sapphire substrate and separating the bonded pair of substrates. The GaN materials or devices are inverted and can be adhered to the second substrate. In some embodiments, the formation and/or delineation of devices on the second substrate is at least partially completed (316). This can be accomplished by the addition and patterning of metal or dielectric films, or etching a portion of the GaN materials. Anchoring, tethering, or encapsulation structures designed to survive a process of releasing the GaN materials from the second substrate can be formed (318). The GaN materials or devices can be released from the second substrate (320) by the removal of at least a portion of a selectively removable layer positioned between at least a portion of the second substrate and at least a portion of the GaN materials or devices. In some embodiments, the released micro assemble-able GaN on an intermediate substrate can be transferred to an intermediate stamp, thereby presenting the GaN in a different, un-inverted, configuration for micro assembly. Thus, method 300 can be used to form released, micro assemble-able GaN materials or devices from sapphire native substrates via an intermediate substrate.

FIG. 4 is a table listing examples of materials and devices for micro assembly, their native substrates, and absorbing layers that can be used. Laser lift-off facilitates the preparation of semiconductor materials and devices for micro assembly. Semiconductor materials and devices are at least partially formed on their native substrate and transferred to an intermediate substrate or stamp according to the procedures outlined in previous sections of the present specification that describe the preparation of GaN materials and devices from a sapphire native substrate. Key elements of the laser lift-off include a native substrate that is transparent to laser illumination that is absorbed strongly by a layer on the native substrate such that upon exposure the absorbing layer can at least partially decompose or otherwise form an interface that can initiate separation between the native substrate and the semiconductor materials and devices for micro assembly. FIG. 4 lists relevant materials and devices for micro assembly, their native substrates, and the absorbing layer.

To create micro LEDs, such as blue micro LEDs, GaN (gallium nitride) semiconductor material can be grown on a sapphire substrate. Sapphire is often the growth substrate of choice for epitaxial GaN layers. However, sapphire limits the construction and performance of the final LED device. For example, the GaN/sapphire composite cannot be as easily diced as silicon. Further, sapphire, in comparison to metals, has poor electrical and thermal conductivity.

In some implementations a laser-reactive exfoliation layer is deposited on rigid substrates and the micro LEDs are formed on the exfoliation layer. To remove or 'lift-off' the semiconductor from the sapphire, a high intensity laser beam is directed through the sapphire and aimed at the GaN. This creates a shockwave at the interface that disassociates the GaN from the sapphire so that the GaN is exfoliated from the sapphire substrate. The principle behind laser lift off is the different absorption of UV light by GaN and sapphire. GaN strongly absorbs the laser radiation, while sapphire is a poor UV absorber due to its high bandgap energy. Laser lift off can be performed quickly and only the interface layer of GaN (or the exfoliation layer) reaches high temperature.

The GaN wafer (and accompanying micro LEDs formed on the GaN wafer) is then transferred and bonded to an intermediate substrate. For example, Si (111) can be used as the intermediate substrate. Printable micro LEDs are then formed on the intermediate substrate. The Si (111) or a sacrificial layer formed thereon prior to transferring the GaN wafer to the Si (111) wafer can be etched such that the position of each printable micro LED is maintained by one or more tethers that facture when each printable micro LED is picked up by a micro transfer device.

Figure 5A:
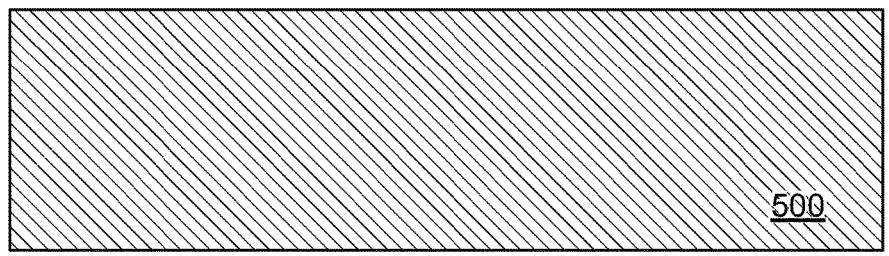
Figure 5B:
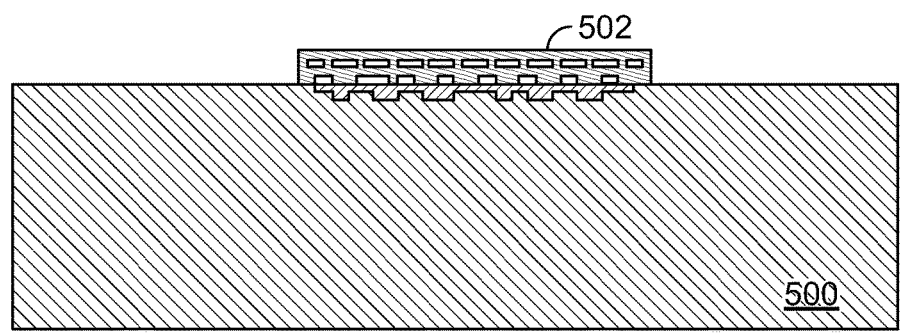
Figure 5C:
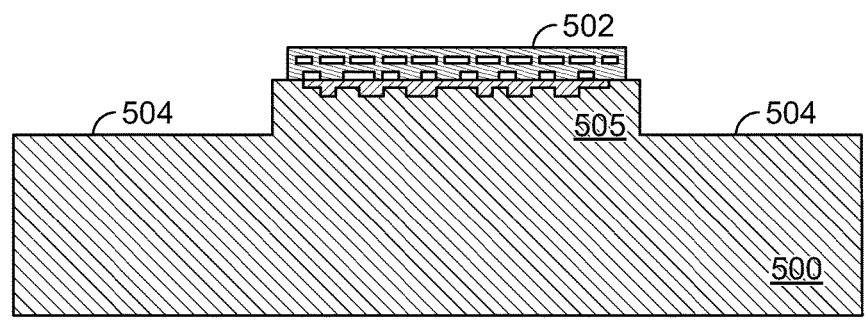

FIGS. 5A-5K illustrate a sequence of steps for forming printable objects from bulk wafers, such as those suitable for assembly using a rubber stamp (e.g., micro-transfer printing). As shown in FIG. 5A, a substrate 500 is provided. Thereafter, a device 502 is formed on the substrate 500 using photolithographic methods and as shown in FIG. 5B. The device 502 is typically one of many devices formed on the substrate. The devices can be microelectronic, optoelectronic, or micromechanical devices. In some embodiments, a trench 504 is formed around device 502 as shown in FIG. 5C, thereby forming a protrusion 505 on the substrate 500.

Figure 5D:
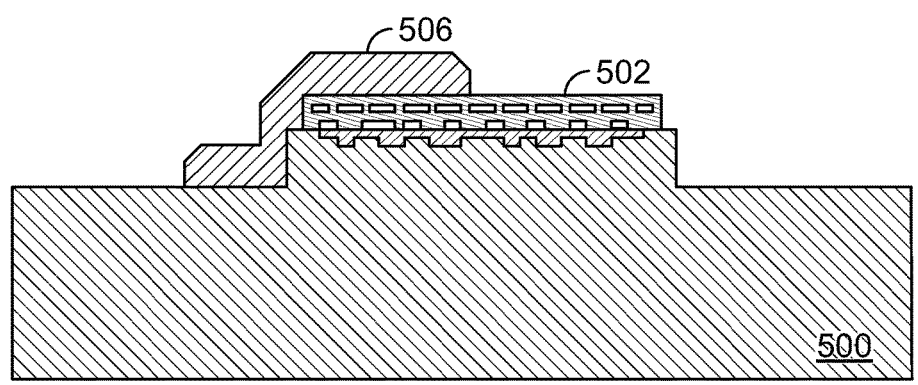

As shown in FIG. 5D, an anchor/tether structure 506 is formed. The anchor/tether structure 506 contacts the device 502 and the substrate 500. The material used for the anchor/ tether structure 506 is selected such that it insoluble in a release chemistry. In some embodiments, the anchor/tether structures is a patterned material. A layer of the desired material can be applied to the system and patterned (e.g., using photolithography). In some embodiments, there are more than one anchor/tether structures 506 per device 502.

Figure 5E:
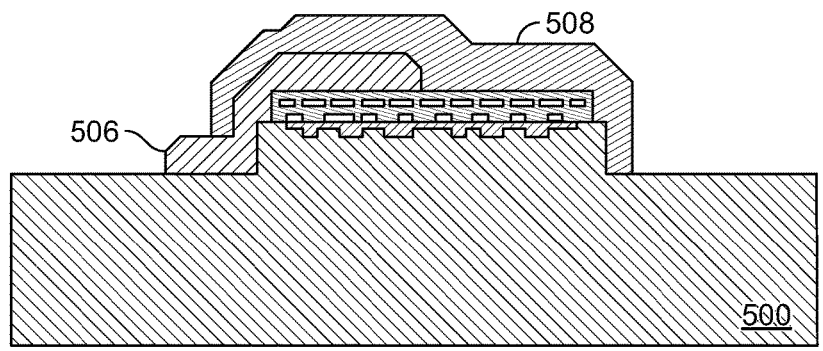

As shown in FIG. 5E, a second material is deposited and patterned to form a sacrificial layer 508. Unlike the anchor/tether structure 506, the sacrificial layer 508 is soluble in a release chemistry. Thus, when etched, for example, with the appropriate solvent the sacrificial layer 508 will be removed and the anchor/tether structure 506 will remain. The sacrificial layer 508, in some embodiments, covers the top surface of the device 502 but exposes the top surface of at least a portion of the anchoring structure 506.

Figure 5F:
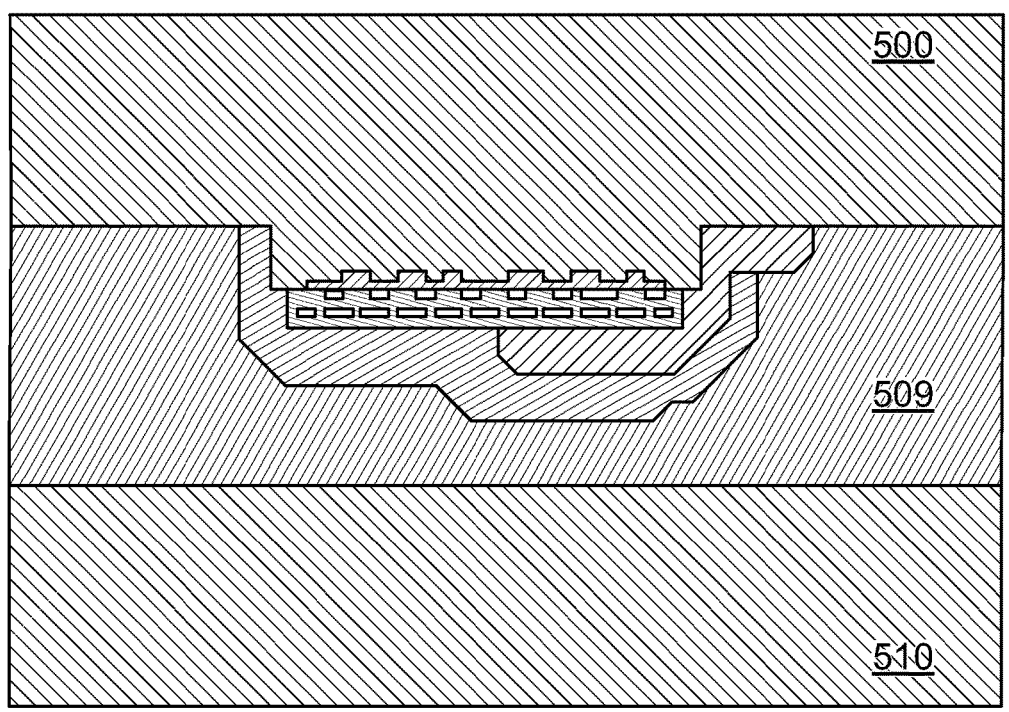

As shown in FIG. 5F, the top surface of the first substrate 500 is bonded to a second substrate 510 using a bonding material 509 (e.g. resin, polyimide, epoxy, eutectic metal, soft metal) that is insoluble in the release chemistry.

Figure 5G:
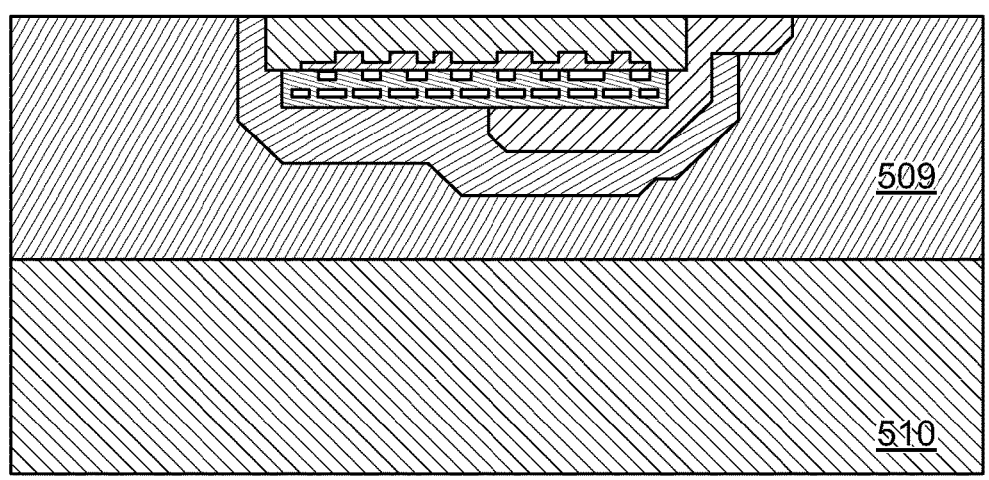
Figure 5H:
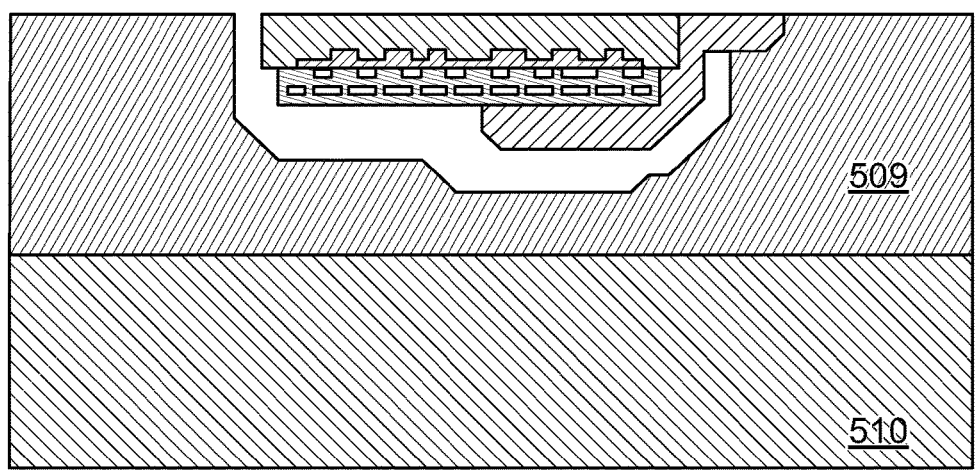
Figure 5I:
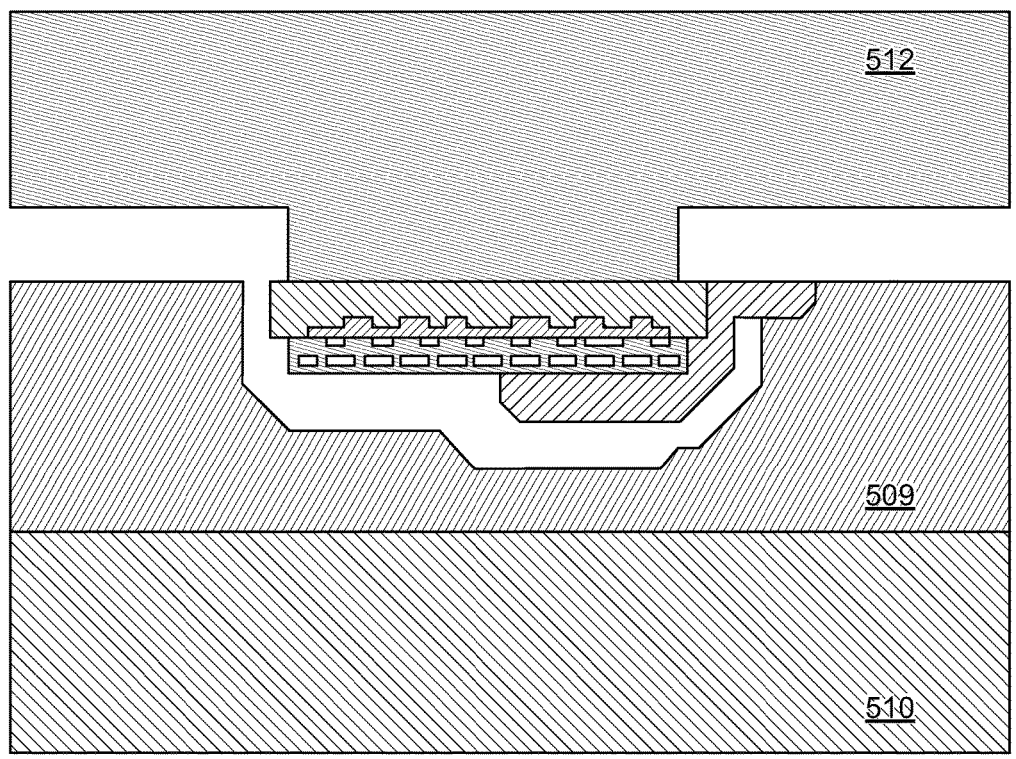
Figure 5J:
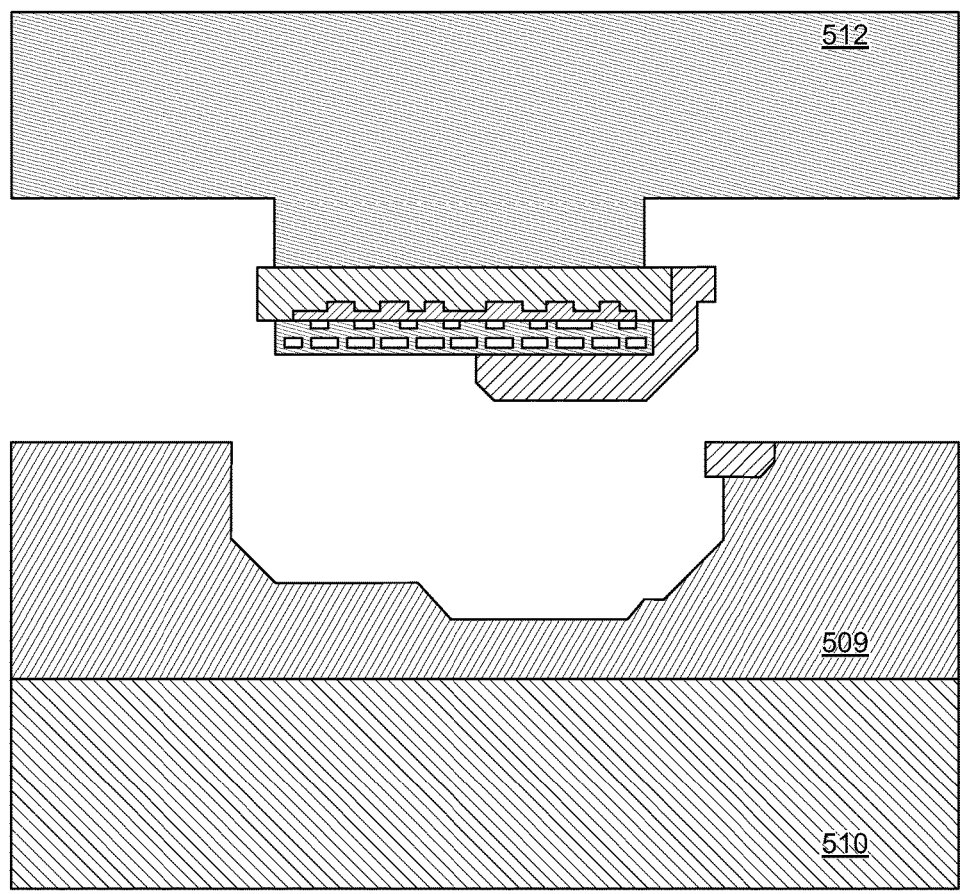

The first substrate 500 is removed as shown in FIG. 5G (e.g. by laser lift off or back grinding) to expose the bottom surface of the device 502, a portion of the anchoring/tethering structure 506, a portion of the sacrificial layer 508, and a portion of the bonding material 509. The sacrificial layer 508 is etched using the release chemistry, thereby forming a releasable and printable object connected to the second substrate 510 through the bonding material 514 by the anchoring/tethering structure as shown in FIG. 5H. Printing occurs by contacting the bottom side of the device 502 with a transfer element 512 (FIG. 5I), and separating the transfer element 512 from the second substrate 510, thereby fracturing the tethers and separating the device from the second substrate 510, as shown in FIG. 5J.

This approach is particularly well suited for forming printable devices from GaN grown epitaxially on sapphire whereby the first substrate is removed by laser lift off, or for forming printable devices from bulk silicon wafers, wherein the first substrate is removed by back grinding.

As shown in FIG. 5K, the device, in some embodiments, includes one or more protrusions 516 on its top surface. These protrusions 516 can be electrically conductive protrusions. The protrusions 516 can contact a contact pad 518 on the destination substrate 514 thereby improving connectivity after transferring the device 502 to the destination substrate 514.

Having described certain implementations of methods and apparatus, it will now become apparent to one of skill in the art that other implementations incorporating the concepts of the disclosure can be used. Therefore, the disclosure should not be limited to certain implementations, but rather should be limited only by the spirit and scope of the following claims.

Throughout the description, where apparatus and systems are described as having, including, or comprising specific components, or where processes and methods are described as having, including, or comprising specific steps, it is contemplated that, additionally, there are apparatus, and systems of the disclosed technology that consist essentially of, or consist of, the recited components, and that there are processes and methods according to the disclosed technology that consist essentially of, or consist of, the recited processing steps.

It should be understood that the order of steps or order for performing certain action is immaterial so long as the disclosed technology remains operable. Moreover, two or more steps or actions can be conducted simultaneously.

What is claimed:

1. A method of preparing released or releasable structures from a silicon native device substrate, the method comprising:
    depositing at least one of GaN, AlGaN, InGaN, InGaAlN, and SiN on a native device substrate comprising Si (1 1 1), thereby forming an epitaxial material;
    forming devices using the epitaxial material on the native device substrate;
    forming releasable structures comprising the devices by removing at least a portion of the epitaxial material from around at least a portion of the devices in the epitaxial material, thereby partially exposing the native device substrate;
    forming anchoring structures and tethering structures that are at least partially in contact with a side of the releasable structure opposite the native device substrate and at least partially in contact with the native device substrate;
    removing silicon material underneath the releasable structures with an etchant to form tethers connecting the releasable structures to anchors, thereby forming printable structures comprising the devices, wherein the position and orientation of the printable structures is maintained by the tethers and anchors.

2. The method of claim 1, comprising exposing the native device substrate and the printable structures connected to the native device substrate by anchoring structures and tethering structures to one or more chemical agents and wherein exposing the native device substrate and the printable structures to one or more chemical agents comprises exposure to heated phosphoric acid.

3. The method of claim 1, comprising exposing the native device substrate and the printable structures connected to the native device substrate by anchoring structures and tethering structures to one or more chemical agents and wherein exposing the native device substrate and the printable structures to one or more chemical agents imparts surface roughness to the newly exposed surface.

4. The method of claim 1, wherein the etchant is heated tetramethyl ammonium hydroxide, potassium hydroxide, sodium hydroxide or a basic solution for performing anisotropic silicon etch.

5. The method of claim 1, wherein forming devices comprises depositing and/or patterning a dielectric and/or conductive thin film.

6. The method of claim 1, wherein the anchoring structures and tethering structures are formed in the epitaxial material.

7. The method of claim 1, wherein the anchoring and tethering structures are formed from non-epitaxial material.

8. The method of claim 1, comprising depositing one or more of silicon nitride, and silicon oxide on the native device substrate.

9. The method of claim 1, comprising forming one or more encapsulating structures to encapsulate at least a portion of the printable structure.

10. The method of claim 1, comprising:
    prior to removing silicon material underneath the structures, forming recesses in the exposed silicon.

11. The method of claim 1, wherein forming recesses in the exposed silicon comprises etching the exposed silicon.

12. The method of claim 1, comprising: micro transfer printing one or more printable substructures of the printable structures.

13. The method of claim 1, wherein said micro transfer printing comprises:

contacting one or more printable structures of the printable structures with a conformable transfer device having a contact surface, wherein contact between the contact surface and the one or more printable structures adheres the one or more printable structures to the contact surface;

contacting the one or more printable structures disposed on the contact surface with the receiving surface of a destination substrate; and separating the contact surface of the conformable transfer device and the one or more printable structures, wherein the one or more printable structures are transferred onto the receiving surface, thereby assembling the one or more printable structures on the receiving surface of the destination substrate.

14. The method of claim 13, wherein the conformable transfer device is an elastomer stamp.

15. A released or releasable structure on a silicon native device substrate, comprising:

a native device substrate comprising Si (1 1 1), having an epitaxial material deposited thereon comprising at least one of GaN, AlGaN, InGaN, InGaAlN, and SiN;

a plurality of devices formed using the epitaxial material on the native device substrate, wherein at least a portion of the epitaxial material is removed from around at least a portion of the devices in the epitaxial material, thereby partially exposing the native device substrate;

anchoring structures and tethering structures that are at least partially in contact with a side of each device opposite the native device substrate and at least partially in contact with the native device substrate;

a cavity in the silicon material underneath the releasable structures defining tethers connecting the devices to anchors, thereby forming printable structures comprising the devices, wherein the position and orientation of the printable structures is maintained by the tethers and anchors.

16. The structure of claim 15, wherein the device has a roughened surface.

17. The structure of claim 15, wherein the native device substrate has a roughened surface.

18. The structure of claim 15, wherein the device comprises dielectric or conductive thin films.

19. The structure of claim 15, comprising silicon nitride or silicon oxide on the native device substrate.

* * * * *